United States Patent [19]

Park

[11] Patent Number: 5,388,161

[45] Date of Patent: Feb. 7, 1995

[54] TONE ADJUSTING APPARATUS FOR AUDIO SIGNALS

[75] Inventor: Keun Park, Seoul, Rep. of Korea

[73] Assignee: Daewoo Electronics Co., Ltd., Seoul, Rep. of Korea

[21] Appl. No.: 112,764

[22] Filed: Aug. 26, 1993

[30] Foreign Application Priority Data

Aug. 28, 1992 [KR] Rep. of Korea .................. 92-15578

[51] Int. Cl.$^6$ ............................................. H03G 5/00
[52] U.S. Cl. ..................................................... 381/98
[58] Field of Search .................. 381/98, 101, 102, 103

[56] References Cited

U.S. PATENT DOCUMENTS 3,602,628  8/1971  Peterson ............................... 84/693

5,172,358  12/1992  Kimura ............................... 381/102

*Primary Examiner*—Forester W. Isen
*Attorney, Agent, or Firm*—William F. Pinsak

[57] ABSTRACT

The bass and the treble bands of audio signals are controlled by the respective bass and treble control voltages which have appropriate DC voltage levels. A plurality of voltage compensators is used to preprocess the bass and treble control voltages to be applied to a tone controller wherein the respective bass and treble bands of a given audio signal are adjusted in proportion to the bass and treble control voltages. Each of the voltage compensators selectively increases or decreases the bass and/or treble control voltages to enhance or attenuate the bass and/or treble band of the given audio signal when activated by a switching controller.

3 Claims, 2 Drawing Sheets

TONE ADJUSTING APPARATUS FOR AUDIO SIGNALS

FIELD OF THE INVENTION

The present invention relates to a tone control apparatus for audio signals; and, more particularly, to an apparatus capable of separately and flexibly adjusting the bass and the treble bands of various audio signals depending on their source-related characteristics.

BACKGROUND OF THE INVENTION

Nowadays, the audio portion of TV signals is often broadcasted in both mono and stereo sounds; and multiplex or multilingual transmission method is also practised in a TV broadcasting system.

For the stereo broadcasting system, enhancement of both bass and treble bands tends to improve the sound quality; while, as for the multiplex system, the treble band is preferably attenuated to minimize the noise components carried by the high frequencies so that an optimum quality sound may hie achieved.

On the other hand, an audio signal reproduced from, e.g., a videotape recording has generally much more noises than a broadcast audio signal. Accordingly, i% is generally preferred to attenuate both bass and treble bands of frequencies for such reproduced audio signal.

In the art, varying levels of DC voltages have been commonly used to control the respective bass and treble bands of an audio signal. One of such known tone control systems is constructed to generate bass and treble control voltages which vary linearly with the operation of the bass and the treble adjust keys, respectively. The variable bass control voltage serves to adjust the bass frequency range of the audio signal to a desired level; and, similarly, the variable treble to control voltage adjusts the treble range of the audio signal to a predetermined level.

However, this type of conventional apparatus has the deficiencies of requiring a manual operation of the bass and the treble adjust keys, which are provided separately for different types of audio signals such as stereo, multiplex and reproduced audio signals.

SUMMARY OF THE INVENTION

It is therefore an object of the invention to provide an apparatus adapted to automatically adjust the "tone" of various types of audio signals which does not require different sets of the tone adjust keys or separate manual operation thereof, regardless of the type of the audio signal.

In accordance with one aspect of the present invention, a voltage compensator preprocesses respective bass and treble control voltages having appropriate DC voltage levels, which are then applied to a tone controller wherein each of the bass and treble control voltages is used to adjust the bass and the treble bands of an audio signal, respectively. The voltage compensator selectively increases or decreases the bass and/or treble control voltages to enhance or attenuate the bass and/or the treble band of the audio signal when activated by a switching controller.

The switching controller serves to detect the source-related characteristics of a given audio signal and produces an activating control signal to activate the voltage compensator in response to the characteristics detected.

BRIEF DESCRIPTION OF THE DRAWINGS

The above and other objects and features of the present invention will become apparent from the following description of the preferred embodiments given in conjunction with the accompanying drawings in which.

DETAILED DESCRIPTION OF THE PREFERRED EMBODIMENTS

Figure 1:
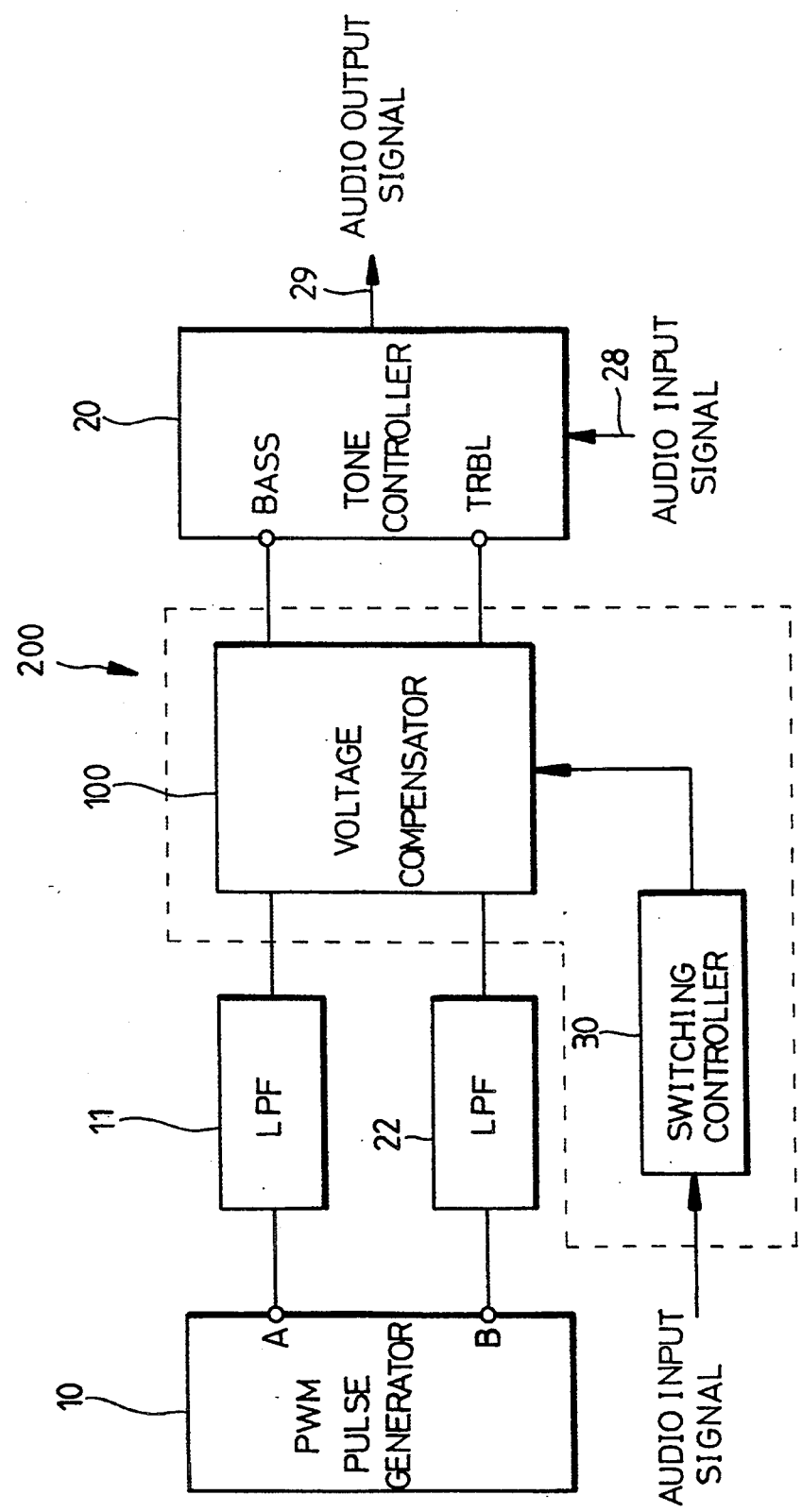
FIG. 1 is a schematic block diagram of a preferred tone adjusting apparatus for use with an audio signal processing system in accordance with the invention.

Referring to FIG. 1, a tone adjusting apparatus 200 is shown to have a DC voltage compensator, generally designated by reference numeral 100, which is incorporated in an audio signal processing system comprising a pulse generator 10, a first and a second voltage converters 11 and 22 for generating a bass and a treble control voltages, and a tone controller 20 to which the bass and treble control voltages are applied.

For exemplary purposes only, the present invention will now be illustrated with reference to an audio signal process commonly employed in a "TVCR" system which incorporates as one unit a TV receiver and a video cassette recorder(VCR) and which is capable of generating various types of audio signals such as stereo, multiplex and reproduced audio signals, wherein the stereo and the multiplex signals may be derived from a FM tuner in the TV receiver and the reproduced signal may be derived from the VCR.

The pulse generator 10 generates PWM(Pulse Width Modulation) pulses with duty factors through its respective output ports A and B which are respectively connected to the first and the second voltage converters 11 and 22, by the operation of a pair of bass and treble adjust keys (not shown), respectively. The voltage converters 11 and 22 are generally comprised of low pass filters, respectively, as will be described in conjunction with FIG. 2; and serve to smoothe the respective PWM pulses and produce DC voltages in levels proportionate to the duty factors of the PWM pulses, respectively. The DC voltages from the respective low pass filters 11 and 22 are supplied as a bass and a treble control voltages to input ports BASS and TRBL in the tone controller 20, respectively.

The tone controller 20 processes a given type of audio signal being input through channel 28 so that the bass and the treble bands of the audio signal are adjusted in proportion to the respective levels of the bass and the treble control voltages; and provides the processed audio signal to a loudspeaker (not shown) through channel 29.

In accordance with the present invention, the bass and the treble control voltages may be preprocessed in the voltage compensator 100 before they are applied to the tone controller 20. The voltage compensator 100 functions to compensate the bass and the treble control voltages to their respective predetermined values, when it is operated by a switching controller 30 as will be described in detail with reference to FIG. 2. As a result, the tone controller 20 produces an audio signal with compensated bass and treble bands, as desired.

Figure 2:
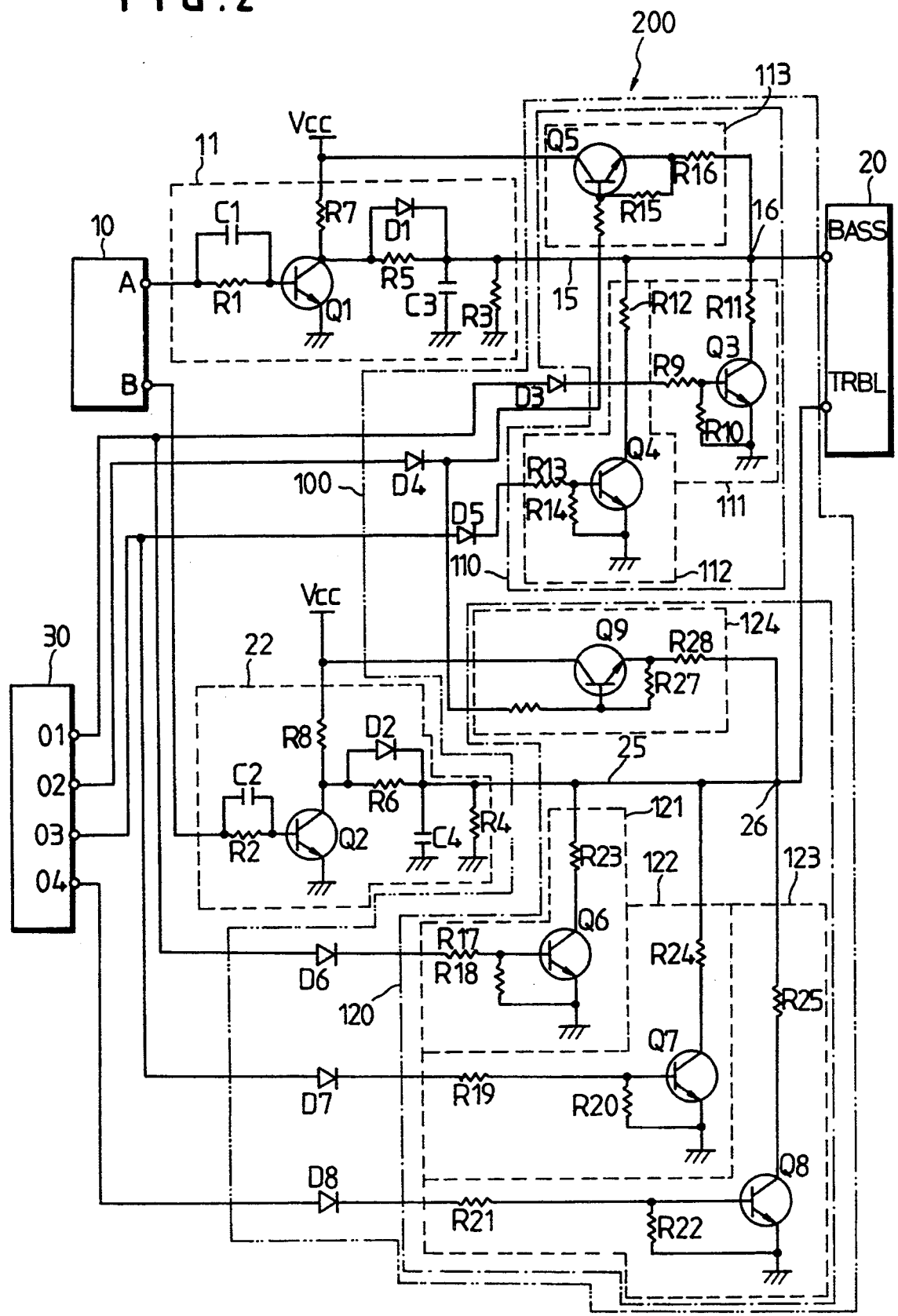
FIG. 2 is a representative circuit diagram of the tone adjusting apparatus shown in FIG. 1.

Referring now to FIG. 2, there is shown a circuit diagram of the tone adjusting apparatus as shown in FIG. 1. As described above, the voltage converters 11 and 22 are essentially low pass filters, respectively. The first low pass filter or voltage converter 11 comprises a switching speed up capacitor C1, a resistor R1, a turn-over amplifying transistor Q1 and an integration circuit having a resistor R5 and a capacitor C3, wherein a diode D1 connected to the resistor R5 in parallel is used to adjust the current characteristic. Similarly, the second low pass filter or voltage converter 22 comprises a switching speed up capacitor C2, a resistor R2, a turn-over amplifying transistor Q2 and an integration circuit having a resistor R6 and a capacitor C4, wherein a diode D2 connected to the resistor R6 in parallel is used to adjust the current characteristic. The low pass filters 11 and 22 are well known in the art and therefore will not be further discussed with respect to their operation.

The switching controller 30 is designed to selectively produce switching control signals through its respective output ports 01 to 04, depending on the specific types of audio signals such as: a reproduced audio signal in a standard play mode, a TV stereo audio signal, a reproduced audio signal in an extended play mode and a TV multiplex sound signal. The switching controller 30 detects, for example, whether the reproduced audio input signal to be processed at the tone controller 20 is derived from a standard play mode or an extended play mode, based on the Fepetition rate of the control track signal from the videotape in the VCR and selectively produces a logic 1(one) signal through its corresponding output port 01 or 03. Similarly, the switching controller 30 determines whether the TV audio signal is either of a stereo or of a multiplex sound, based on the pilot signal carried by the broadcast signal and selectively produces a logic 1(one) signal through its corresponding output port 02 or 04.

The switching controller 30 may be implemented with a single microprocessor or microcomputer incorporating the PWM generator 10, rather than with the PWM generator and the switching controller, constructed separately, as is well known in the art.

The voltage compensator 100 is divided into two parts 110 and 120 for the compensation of the bass and the treble control voltages from the low pass filters 11 and 22, respectively, according to the switching control signal from the switching controller 30. The first part 110 is designed to compensate the bass control voltage and has a first and a second voltage down circuits 111 and 112 and a voltage up circuit 113. The first voltage down circuit 111 has a switching transistor Q3 whose base is connected to the output port 01 of the switching controller 30 through an isolation diode D3 and a bias resistor R9 connected in series with each other, another bias resistor R10 connected between the base and an emitter of the transistor Q3 which is connected ground, and a voltage dividing resistor R11 connected to a collector of the transistor Q3 connected to a path 15 passing the bass control voltage from the first low pass filter 11 to the input port BASS of tone controller 20. The second voltage down circuit 112 has a switching transistor Q4 whose base is connected to the output port 03 of the switching controller 30 through an isolation diode D5 and a bias resistor R13 connected in series with each other, another bias resistor R14 connected between the base and an emitter of the transistor 04 which is connected to ground and a voltage dividing resistor R12 connected between a collector of the transistor Q4 and the path 15, wherein the resistance of the resistor R12 is established at a level lower than that of the resistor R11 in the voltage down circuit 111.

On the other hand, the voltage up circuit 113 has a switching transistor Q5 whose base is connected to the output port 02 of the switching controller 30 through an isolation diode D4 and whose collector is connected to a voltage source Vcc, and a pair of bias resistors R15 and R16 connected between the base and an emitter of the transistor 05 and between the emitter and the path 15, respectively.

Similar to the first voltage compensating part 110, the second part 120 has a third, a fourth and a fifth voltage down circuits 121, 122 and 123 and a voltage up circuit 124. The third voltage down circuit 121 has a switching transistor Q6 whose base is connected to the output port 01 of the switching controller 30 through an isolation diode D5 and a bias resistor R17 connected in series with each other, another bias resistor R18 connected between the base and an emitter of the transistor Q6 which is connected to ground, and a voltage dividing resistor R23 connected between a collector of the transistor Q6 and a path 25 passing the treble control voltage from the second low pass filter 22 to the input port TRBL of the tone controller 20.

The fourth voltage down circuit 122 has a switching transistor Q7 whose base is connected to the output port 03 of the switching controller 30 through an isolation diode D7 and a bias resistor R19 connected in series with each other, another bias resistor R20 connected between the base and an emitter of the transistor Q7 which is connected to ground, and a voltage dividing resistor R24 connected between a collector of the transistor Q7 and the path 25. In this case, the resistance of the resistor R24 is established at a level lower than that of the resistor R23 in the third voltage down circuit 121.

The fifth voltage down circuit 123 has a switching transistor Q8 whose base is connected to the output port 04 of the switching controller 30 through an isolation diode D8 and a bias resistor R21 connected in series with each other, another bias resistor R22 connected between the base and an emitter of the transistor Q8 which is connected to ground, and a voltage dividing resistor R25 connected between a collector of the transistor 08 and the path 25.

The voltage up circuit 124 has a switching transistor Q9 whose base is connected to the output port 02 of the switching controller 30 through the isolation diode D4 and whose collector is connected to a voltage source Vcc, and a pair of bias resistors R27 and R28 connected between the base and an emitter of the transistor Q9 and between the emitter and the path 25, respectively.

In the following description on the operation of the tone adjusting apparatus in accordance with the present invention, it will be assumpted that each of the base and the treble adjust keys remains at a fixed condition wherein the PWM generator 10 produces constant PWM pulses.

Considering first the tone adjustment of a reproduced audio signal in a standard VCR play mode, the reproduced VCR audio signal may have more noise components than a normal TV audio signal. Therefore, it is preferable to attenuate both the high and the low frequency bands which carry the noise components in order to achieve a good sound quality.

Accordingly, for the reproduced VCR audio signal in standard play mode, the switching controller 30 produces a high level switching voltage through its output port 01 upon detecting that the audio signal to be processed is a reproduced VCR audio signal in the standard play mode. The high level switching voltage allows to activate the transistors Q3 and Q6 in the respective voltage down circuits 111 and 121.

The PWM generator 10 generates PWM pulses through its output ports A and B, respectively. The respective PWM pulses are converted by the respective low pass filters 11 and 22 to DC voltage levels which are supplied to the input ports BASS and TRBL of the tone controller 30 as a bass and a treble control voltages, respectively.

And then, a part of the bass control voltage distributed by the voltage dividing resistor R11 when the switching transistor Q3 is activated by the switching controller 30, while a part of the treble control voltage is distributed by the voltage dividing resistor R23 when the transistor Q6 is activated by the switching controller 30. Accordingly, the bass and the treble control voltages from the respective low pass filters 11 and 22 will be reduced before being supplied to the respective input ports BASS and TRBL of the tone controller 20. As a result, the tone controller 20 processes the bass and the treble sound bands of the reproduced VCR audio signal with the reduced bass and treble control voltages, respectively, thereby producing the adjusted audio signal of a desired quality.

Secondly, with respect to a reproduced audio signal in an extended VCR play mode, the reproduced VCR audio signal will normally have further more noise components than the VCR audio signal in the standard play mode. Therefore, it is desirable to reduce the bass and treble frequencies of the VCR audio signal in the extended play mode further.

Accordingly, upon identifying the source characteristics of the audio signal, the switching controller 30 produces a high level switching voltage through its output port 03 to cause the transistors Q4 and Q7 in the voltage down circuits 111 and 122 to activate, respectively. When each of the transistors Q4 and Q7 is activated, the bass and the treble control voltages from the first and the second low pass filters 11 and 22 are partially distributed by the voltage dividing resistors R12 and R24, respectively, and then the voltages reduced by the resistors R12 and R24, respectively, are applied to the input ports BASS and TRBL of the tone controller 20. In this case, each of the reduced bass and treble control voltages to be applied to the tone controller 20 will be lowered more than those of the reproduced audio signal in the standard play mode since the respective resistors R12 and R24 have higher resistances than those of the resistors R11 and R23 in the voltage reducing circuits 111 and 121, respectively. Accordingly, the bass and treble frequencies of the VCR audio signal will be further attenuated by the reduced bass and treble control voltages applied to the input ports BASS and TRBL of the tone controller 20, respectively.

Considering now a TV stereo audio signal, the respective bass and treble bands of the stereo sound should preferably be enhanced to achieve a better sound quality. Accordingly, when the stereo audio signal is received, the switching controller 30 produces a high level switching voltage through its output port 02 and provides it to the respective voltage up circuits 113 and 124 to cause the transistors Q5 and Q9 to activate. When each of the transistors Q5 and Q9 is activated, each of the Vcc voltage is added at points 16 and 26 to the respective bass and treble control voltages from the low pass filters 11 and 12, respectively. The added voltages are applied to the input ports BASS and TRBL of the tone controller 20 as a compensated bass and treble control voltages, respectively. Accordingly, the bass and treble bands of the stereo audio signal can be enhanced according to the compensated bass and treble control voltages in the tone controller 20, respectively.

In case where the audio signal is of a TV multiplex sound, the quality of the multiplex sound can be improved by removing the noise components carried by the high frequency. Therefore, it is desirable to reduce the treble band of the multiplex sound signal to a level lower than that of a normal audio signal.

Accordingly, when the multiplex sound signal is detected, the switching controller 30 produces a high level switching voltage and provides it to the voltage down circuit 123 through its output port 04 to cause the transistor Q8 to activate. When the transistor 08 is activated, a part Of the treble control voltage from the second low pass filter 22 is distributed by the voltage dividing resistor R25. Therefore, the treble control voltage is reduced by the amount of the distributed voltage by the resistor R25 and then the reduced treble control voltage is applied to the input port TRBL of the tone controller 20 so that the treble frequency band of the multiplex sound signal can be appropriately adjusted with the reduced treble control voltage in the tone controller 20. As a result, the tone control of various types of audio signals can be automatically achieved depending on their characteristics.

While the present invention has been shown and described with reference to the particular embodiments, it will be apparent to those skilled in the art that many changes and modifications may be made without departing from the spirit and scope of the invention as defined in the appended claims.

What is claimed is:

1. A tone adjusting apparatus for different types of audio signals for use with an audio signal processing system including a voltage converter for generating a bass and a treble control voltages necessary to control the bass and the treble bands of a given type of audio signal and a tone controller wherein the bass and the treble bands of the given type of audio signal are adjusted in proportion to the bass and the treble control voltages applied thereto, the apparatus comprising:

means for compensating the bass and the treble control voltages before the bass and the treble control voltages are applied to the tone controller, wherein the compensating means includes:
   means for lowering the bass control voltage;
   means for increasing the bass control voltage;
   means for lowering the treble control voltage; and
   means for increasing the treble control voltage, wherein each of the bass and the treble control voltage lowering means has a switching transistor whose base is adapted to receive the activating control signal, whose emitter is connected to ground and whose collector is connected to a path passing the respective bass and the treble control voltages to the tone controller, and a voltage dividing resistor connected between the path and the collector; and means for detecting the characteristics of the given type of audio signal and for selectively producing an activating control signal to activate said compensating means in relation to the detected characteristics.

2. The apparatus of claim 1, wherein each of the bass and the treble control voltage lowering means comprises a further voltage dividing resistor connected between the path and the tone controller, and wherein said further voltage dividing resistor has a greater resistance than the voltage dividing resistor.

3. A tone adjusting apparatus for different types of audio signals for use with an audio signal processing system including a voltage converter for generating a bass and a treble control voltages necessary to control the bass and the treble bands of a given type of audio signal and a tone controller wherein the bass and the treble bands of the given type of audio signal are adjusted in proportion to the bass and the treble control voltages applied thereto, the apparatus comprising:

means for compensating the bass and the treble control voltages before the bass and the treble control voltages are applied to the tone controller, wherein the compensating means includes:

means for lowering the bass control voltage;

means for increasing the bass control voltage;

means for lowering the treble control voltage; and means for increasing the treble control voltage, wherein each of the bass and the treble control voltage increasing means has a switching transistor whose base is adapted to receive the activating control signal, whose collector is connected to a voltage source and whose emitter is connected to a path passing the respective bass and the treble control voltages to the tone controller; and means for detecting the characteristics of the given type of audio signal and for selectively producing an activating control signal to activate said compensating means in relation to the detected characteristics.

* * * * *